United States Patent [19]
Tsang

[11] 4,264,916
[45] Apr. 28, 1981

[54] SEMICONDUCTOR BARRIER JOSEPHSON JUNCTION

[75] Inventor: Won-Tien Tsang, New Providence, N.J.

[73] Assignee: Bell Telephone Laboratories, Incorporated, Murray Hill, N.J.

[21] Appl. No.: 106,407

[22] Filed: Dec. 26, 1979

[51] Int. Cl.³ .............................................. H01L 39/22
[52] U.S. Cl. ..................................... 357/5; 307/306; 29/599
[58] Field of Search .......................... 357/5; 307/306; 331/107 S; 29/599

[56] References Cited

U.S. PATENT DOCUMENTS

| | | | |
|---|---|---|---|
| 3,791,721 | 8/1973 | Fulton | 317/234 |
| 4,099,305 | 7/1978 | Cho | 29/579 |
| 4,145,699 | 3/1979 | Hu | 357/5 |
| 4,178,602 | 12/1979 | Kandyba | 357/4 |

OTHER PUBLICATIONS

Huang, *Appl. Phys. Lett.*, vol. 25, No. 12, Dec. 15, 1974, pp. 753-756.
Silver, *AIP COnf. Proceedings*, No. 44, 1978, pp. 364-379.
Octavio et al, *IEEE Trans. on Magnetics*, vol. MAG-13, No. 1, Jan. 1977.

*Primary Examiner*—Martin H. Edlow
*Attorney, Agent, or Firm*—Michael J. Urbano

[57] ABSTRACT

A semiconductor barrier Josephson junction device (10) comprises a semiconductor body (12) having a pair of parallel noncoplanar major surfaces (14, 16) which are joined along parallel edges (18, 20) by an oblique surface (22) which forms an acute angle with the major surfaces. Superconductive electrodes (24, 26) on the major surfaces extend near to the parallel edges and thereby define the tunneling barrier as the semiconductor region which extends along the oblique surface. Also described is an array of such junctions connected in series.

6 Claims, 2 Drawing Figures

SEMICONDUCTOR BARRIER JOSEPHSON JUNCTION

BACKGROUND OF THE INVENTION

This invention relates to superconductive devices and, more particularly, to Josephson junction-type devices with semiconductor tunneling barriers.

Weak-link supercurrent devices take on a variety of configurations including point contact and restricted bridge structures as well as the more common thin film geometry. Devices in the latter class are generally formed by a thin tunneling barrier interposed between a pair of superconductors. This barrier may be a thin, normal metal layer in which case the device operation relies on the proximity effect, or, in more classic Josephson sense, may be a thin oxide layer, in which case operation is based on two-particle tunneling. More recently, some workers have succeeded in realizing experimental versions of Josephson junction-type devices in which the barrier is made of a semiconductor material such as single crystal Si [Huang and Van Duzer, APL, 25, 753 (1974)] or polycrystalline Sn/Ge [Hu and Jackel, U.S. Pat. No. 4,145,699 (1979)]. Hu et al used molecular beam deposition to grow the Sn/Ge barrier layer, the thickness and composition of which determine the capacitance and hysteresis of the junction. But, the polycrystalline nature of the barrier implies less reproducibility than a single crystal barrier, all other things being equal. In contrast, Huang et al etched wells into single crystal Si to produce precisely thinned membranes of heavily doped Si on which superconductor films are deposited. However, according to A. H. Silver et al [*AIP Conference Proceedings*, No. 44, page 364 (1978)], a principal problem with the latter technique is the alignment of two counter-electrodes on opposite sides of the membrane. In addition, it suffers from the fragility attendant the fabrication and handling of thin membranes.

SUMMARY OF THE INVENTION

In accordance with one aspect of my invention, a semiconductor barrier Josephson junction device can be fabricated from single crystal material without the need to etch and handle thin membranes. In one embodiment, the device comprises a single crystal, semiconductor body having a pair of parallel, noncoplanar major surfaces which are joined along parallel edges by an oblique surface which forms an acute angle with the major surfaces. Superconductive electrodes on the major surfaces extend near to the parallel edges and thereby define the tunneling barrier as the semiconductor region which extends along the oblique surface.

This configuration of the surfaces of the semiconductor body may be achieved by the use of suitable preferential etchants to form, for example, trapezoidal channels and inverted trapezoidal ridges, and the electrodes may be simultaneously deposited by evaporation so that, in self-masking fashion, one electrode is formed on the top of a ridge and the other is formed on the bottom of the adjacent channel.

BRIEF DESCRIPTION OF THE DRAWING

My invention, together with its various features and advantages, can be readily understood in the following more detailed description taken in conjunction with the accompanying drawing in which.

DETAILED DESCRIPTION

Figure 1:
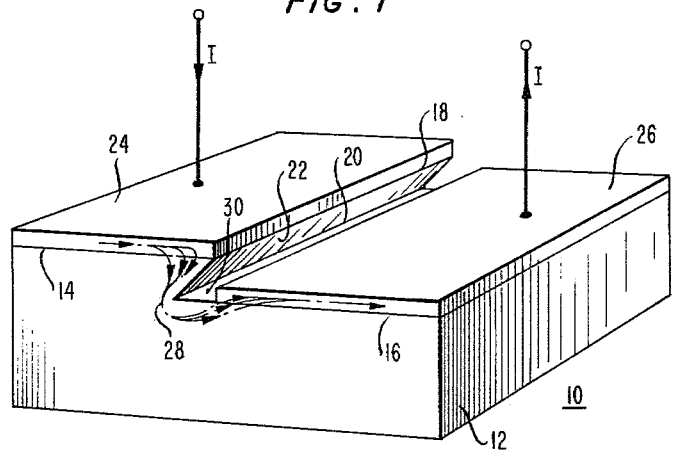
FIG. 1 is a schematic, isometric view of a Josephson tunneling junction in accordance with one embodiment of my invention.

With reference now to FIG. 1, there is shown a Josephson junction device 10 which includes a single crystal semiconductor body 12 having a pair of parallel, noncoplanar major surfaces 14 and 16 which terminate, respectively, along parallel edges 18 and 20. These surfaces are joined by an oblique surface 22 which forms an acute angle with each of the major surfaces. One superconductive electrode 24 is deposited on surface 14 so as to extend near to edge 18, whereas another superconductive electrode 26 is deposited on surface 16 so as to extend near to edge 20. When current I is applied to electrode 24, it follows the path generally defined by arrow 28 into the semiconductor body 12, along oblique surface 22, around the corner defined by edge 20 and into electrode 26. Thus, the tunneling barrier comprises that portion of semiconductor body 12 which extends along oblique surface 22 and the surface segment 30 between edge 20 and electrode 26. The distance between surfaces 14 and 16 as well as the angle of surface 22 determine the length of the barrier which, in conjunction with the material of body 12, determine the capacitance and hysteresis of the device.

The precise angle of surface 22 is not critical, however, inasmuch as its primary function is to insure that electrodes 24 and 26 can be simultaneously deposited (e.g., evaporated) and yet be bifurcated. That is, the shadowing effect produced by the portion surface 14 which overhangs surface 16 insures that electrodes 24 and 26 will be physically separate from one another provided that the angle of evaporation is appropriately chosen and provided that the total thickness of electrode 26 is less than the distance between surfaces 14 and 16. In particular, if the surface 22 makes an acute angle $\theta$ with surface 16 (i.e., $0 < \theta \leq 90$ degrees), then the angle $\Phi$ of evaporation, also measured to surface 16 (or to surface 14) in a plane perpendicular to the channel, should be such that $\Phi > \theta$. In contrast, if $\theta > 90$ degrees, then $\Phi < 180 - \theta$.

Illustratively, the barrier thickness, i.e., the tunneling length through body 12, is in the range of about 250 Angstroms to 800 Angstroms, depending on the distance between surfaces 14 and 16 and the angle of surface 22. These dimensions can be accurately controlled by the use of a suitable preferential etchant in conjunction with an appropriate semiconductor body 12. For example, if the body 12 comprises (001) oriented GaAs, then the surface configuration of FIG. 1 can be realized in the following manner. The body may be etched-polished in a bromine methanol solution and then coated with a standard photoresist (e.g., AZ-1350J). A parallel array of photoresist stripes about 20 μm wide on 250 μm centers may be formed on the surface (i.e., major surface 14) using conventional photolithographic techniques. These stripes should be aligned in the [110] direction (parallel to the desired direction of edges 18 and 20) and are used as masks in subsequent chemical etching using a preferential etching solution of $H_2SO_4$:$H_2O_2$(30%):$H_2O = 1:8:10$ (24 degrees C.). This solution has an etch rate of about 3 μm per minute and forms parallel inverted trapezoidal ridges separated by parallel trapezoidal channels (see FIG. 2). A slower etch rate may be preferable for achieving thin barriers. For example, the same solution in a 1:8:40 ratio has an etch rate of 170 Angstroms/sec. at 19 degrees C. and 50 Angstroms/sec. at 0 degrees C. The oblique surface 22 is a crystallographic side wall of the ridges and is a {111} plane which forms an angle of about 57 degrees with surfaces 14 and 16. Next, the photoresist mask is removed and followed by a brief chemical cleaning (about a 5 second dip in the same etchant as above is suitable). The body 12 is mounted inside an evaporation chamber to deposit simultaneously electrodes 24 and 26 on surfaces 14 and 16 by using an evaporation direction which is essentially perpendicular to surfaces 14 and 16. Alternatively, body 12 may comprise (100) oriented single crystal silicon with the masked stripes aligned along the (010) or (001) directions. When this masked surface is subjected to a preferential etchant comprising a solution of ethylenediamine-water-pyrocatechol, a right-angled surface 22 comprising a (OOT) Si surface is formed.

While the barrier thickness (approximately the distance between surfaces 14 and 16) is about 250-800 Angstroms, the junction length (along the channel) is not critical and illustratively may be 1-10 $\mu$m depending on the desired application. On the other hand, the thickness of the superconductors 24 and 26 is limited only by the distance between surfaces 14 and 16 and the need for the metal film to be continuous. Thus, for a 500 Angstrom barrier, the superconductors might be 200-300 Angstroms thick.

Figure 2:
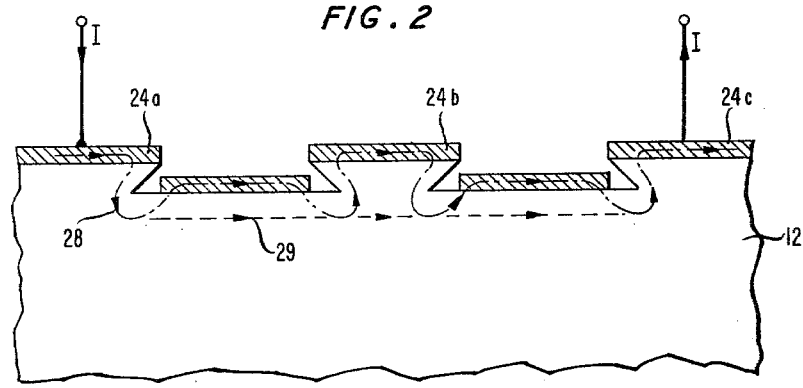
FIG. 2 is a partial, cross-sectional side view of another embodiment of my invention in which a plurality of the junctions of FIG. 1 are monolithically connected in series.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, an array of Josephson tunneling junctions of the type shown in FIG. 1 may be monolithically formed on a single semiconductor body 12, as shown in FIG. 2. These junctions are electrically connected in series with respect to current I applied to contact 24a and extracted from contact 24c. The flow of current through the array is depicted by the solid line 28 which indicates that current flows sequentially through each of the four junctions connected in series. Alternatively, a portion of the current may flow along the dashed line path 29 so as to skip one or more of the intermediate junctions. These arrays may be important as millimeter wave detectors having improved impedance matching characteristics and detection sensitivity. This sensitivity is believed to increase as $N^2$ where N is the number of tunnel junctions connected in series. In this regard, a large number of tunneling junctions can be closely spaced (e.g., $\leqq 4$ $\mu$m) by use of well-known photolithographic or laser beam interferometric techniques to generate the photoresist mask for preferentially etching the trapezoidal channels in semiconductor body 12. An additional advantage of this array is that the junctions in series will be extremely uniform in performance because they are essentially identical in physical structure. Finally, it should be noted that the process described for fabricating tunneling junctions in accordance with my invention requires no sophisticated equipment, such as an electron beam system, to form the small semiconductor barrier region needed for tunneling between superconductors. Instead, my technique employs only relatively inexpensive process steps such as photolithography, chemical etching and metal evaporation. Finally, my invention is not limited to the particular materials, GaAs and Si, described herein above but is applicable to a broad range of semiconductor materials which can be suitably etched to provide the surface configuration depicted in FIG. 1. Thus, appropriate materials also include Group III-V compounds in general as well as Group II-VI compounds and Ge. In addition, it is also possible to fabricate normal metal Josephson junction devices by evaporating a normal metal film over the semiconductor surface shaped as described above and prior to evaporation of the superconductors.

I claim:

1. A superconductive tunneling device comprising
   a body of single crystal, semiconductor material having on one side of said body first and second parallel, noncoplanar, major surfaces and a third surface oriented at an acute angle thereto so as to join said first and second major surfaces along respectively first and second parallel edges thereof,
   a first superconductive electrode located on said first major surface and extending near to said first edge, and
   a second superconductive electrode located on said second major surface and extending near to said second edge,
   the size of said third surface and the proximity of said electrodes to said edges being mutually adapted to allow two-particle tunneling through said body and between said electrodes.

2. The device of claim 1 wherein said body has formed therein a trapezoidal channel and adjacent thereto an inverted trapezoidal ridge, such that said third surface is a side wall of said channel, said second major surface is the bottom of said channel and said first major surface is the top of said ridge.

3. The device of claims 1 or 2 wherein one edge of said first electrode is coincident with said first edge and an adjacent edge of said second electrode is spaced from said second edge.

4. The device of claims 1 or 2 wherein the distance between said first and second major surfaces is in the range of about 250 to 800 Angstroms.

5. An array of superconductive tunneling devices comprising
   a body of single crystal, semiconductor material having a plurality of trapezoidal channels, separated by inverted trapezoidal ridges, formed in a major surface thereof,
   first superconductive electrodes formed on the tops of said ridges, and
   second superconductive electrodes formed on the bottom of said channels physically separate from said first electrodes,
   the distance between the top of said ridges and the bottom of said channels being adapted to allow two-particle tunneling through the portion of said body between adjacent ones of said first and second electrodes when current is applied to one of said electrodes and extracted from another.

6. A method of making a superconductive tunneling device comprising the steps of
   etching a channel in a major surface of a single crystal, semiconductor body so as to form an inverted trapezoidal ridge having an oblique surface at an acute angle $\theta$ to said major surface, and evaporating superconductive metal onto said body from a direction Φ greater than θ, where Φ is measured from said major surface in a plane perpendicular to said channel, thereby to form a first superconductive electrode on top of said ridge and a second superconductive electrode on the bottom of said channel.

* * * * *